United States Patent
Han et al.

(10) Patent No.: US 8,730,654 B2
(45) Date of Patent: May 20, 2014

(54) UNINTERRUPTIBLE POWER SUPPLY MODULE UNIT AND UNINTERRUPTIBLE POWER SUPPLY INCLUDING THE SAME

(75) Inventors: Jung-Yup Han, Yongin-si (KR); No-Hyun Kwag, Yongin-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 338 days.

(21) Appl. No.: 12/881,045

(22) Filed: Sep. 13, 2010

(65) Prior Publication Data

US 2011/0122558 A1    May 26, 2011

(30) Foreign Application Priority Data

Nov. 23, 2009 (KR) .................. 10-2009-0113350

(51) Int. Cl.
*H05K 5/00* (2006.01)
(52) U.S. Cl.
USPC ................................ 361/679.01; 361/679.02
(58) Field of Classification Search
USPC .................. 361/679.01, 18, 62, 90, 614, 639, 361/679.02, 724, 727–730; 174/50
See application file for complete search history.

(56) References Cited

U.S. PATENT DOCUMENTS

2009/0262266 A1* 10/2009 Harbin et al. ................. 349/1
2010/0250162 A1*  9/2010 White et al. .................. 702/63

FOREIGN PATENT DOCUMENTS

| JP | 2008-530730 | 8/2008 |
|---|---|---|
| KR | 10-2007-0017736 | 2/2007 |
| KR | 10-2008-0025430 | 3/2008 |

* cited by examiner

*Primary Examiner* — Jeremy C Norris
*Assistant Examiner* — Tremesha S Willis
(74) *Attorney, Agent, or Firm* — Knobbe Martens Olson & Bear LLP

(57) ABSTRACT

A UPS module includes a battery; a case accommodating the battery; a terminal disposed on a side of the case so as to transmit or receive electric signals representing data about a status of the battery to or from an external device; and a terminal unit disposed on another side of the case to be electrically connected to an external device for charging or discharging the battery.

17 Claims, 7 Drawing Sheets

UNINTERRUPTIBLE POWER SUPPLY MODULE UNIT AND UNINTERRUPTIBLE POWER SUPPLY INCLUDING THE SAME

RELATED APPLICATIONS

This application claims the benefit of Korean Patent Application No. 10-2009-0113350, filed on Nov. 23, 2009, in the Korean Intellectual Property Office, the disclosure of which is incorporated herein by reference in its entirety.

BACKGROUND

1. Field

One or more embodiments of the present invention relate to an uninterruptible power supply (UPS) module and a UPS including the same, and more particularly, to a unit UPS module including a data communication terminal and a UPS including the unit UPS module.

2. Description of the Related Technology

In general, an uninterruptible power supply (UPS) is a device for supplying electric power to a server or a load, such as screen doors of subway stations, to which the power supply is constantly maintained. In general, the UPS includes a battery, and electric power stored in the battery is supplied to a load when power supplied through an electric power line inserted in the UPS is suspended. The battery is typically charged in a floating charging method, which sets a charging voltage in a state where a plurality of cells are connected in series with each other and charging and discharging of the battery are repeated corresponding to a change in an electric current flowing in the battery.

SUMMARY

Additional aspects will be set forth in part in the description that follows and, will be apparent from the description, or may be learned by practice of the presented embodiments.

According to one or more embodiments of the present invention, a unit uninterruptable power supply (UPS) module includes: a battery; a case accommodating the battery; a terminal disposed on a side of the case so as to transmit or receive electric signals representing data about a status of the battery to or from an external device; and a terminal unit disposed on the other side of the case to be electrically connected to an external device, for charging and discharging the battery.

The data communication terminal may include at least a first terminal unit and a second terminal unit which respectively transmit and receive electric signals to and from a first sensor measuring a temperature of the battery and a second sensor measuring an electrically charged status of the battery.

The terminal may include: a connector comprising a plurality of protruding pins for electric connection; and a printed circuit board (PCB) comprising coupling recesses corresponding to the plurality of pins so that the plurality of pins are inserted into the coupling recesses to be coupled to the connector, wherein a width of the PCB may be greater than a width of the connector.

A circuit device for at least one of the first sensor and the second sensor may be attached to the PCB.

The case may include: an upper case; and a lower case, wherein the upper case and the lower case may respectively include recesses corresponding to at least a part of the PCB and a part of the connector, and the data communication terminal may be inserted in the recess, and the upper case and the lower case are coupled to each other so that the data communication terminal is coupled to the case. The data communication terminal may be accommodated in the case so as not to protrude from the case. The data communication terminal may be coupled to the case so that a part of the data communication terminal protrudes from the case.

According to an aspect of the present invention, a UPS includes: at least one UPS module which includes a battery, a case accommodating the battery, a data communication terminal disposed on a side of the case so as to transmit or receive electric signals representing data about a status of the battery to or from an external device; and a terminal unit disposed on another side of the case to be electrically connected to an external device, for charging and discharging the battery; and a first case accommodating the at least one UPS module and comprising at least one corresponding terminal that is electrically connected to the data communication terminal.

The data communication terminal may include at lest a first terminal unit and a second terminal unit which respectively transmit and receive electric signals to and from a first sensor measuring a temperature of the battery and a second sensor measuring an electrical charge status of the battery. The data communication terminal may include: a connector including a plurality of protruding pins for electric connection; and a printed circuit board (PCB) including coupling recesses corresponding to the plurality of pins so that the plurality of pins are inserted into the coupling recesses to be coupled to the connector, wherein a width of the PCB may be greater than a width of the connector.

The pins corresponding to the first terminal unit and the pins corresponding to the second terminal unit may be disposed so as to be the farthest from each other in the connector.

A circuit device for at least one of the first sensor and the second sensor may be attached to the PCB.

The case may include: an upper case; and a lower case, wherein the upper case and the lower case may respectively include recesses corresponding to at least a part of the PCB and a part of the connector, the data communication terminal is inserted in the recess and the upper case and the lower case are coupled to each other so that the data communication terminal is coupled to the case.

The UPS may further include a controller receiving electric signals from the first sensor and the second sensor in order to measure, analyze, and control change variation and electric status of the battery. The data communication terminal and the first corresponding terminal may be coupled to each other in a hermaphroditic coupling method.

The first case may further include a guide structure so that the unit UPS module is slid along the guide structure and the data communication terminal of the unit UPS module is coupled to the first corresponding terminal.

The UPS may further include a bus bar for electrically connecting the terminal unit to the external device.

BRIEF DESCRIPTION OF THE DRAWINGS

These and other aspects will become apparent and more readily appreciated from the following description of the embodiments, taken in conjunction with the accompanying drawings of which.

DETAILED DESCRIPTION OF THE EMBODIMENTS

Figure 1:
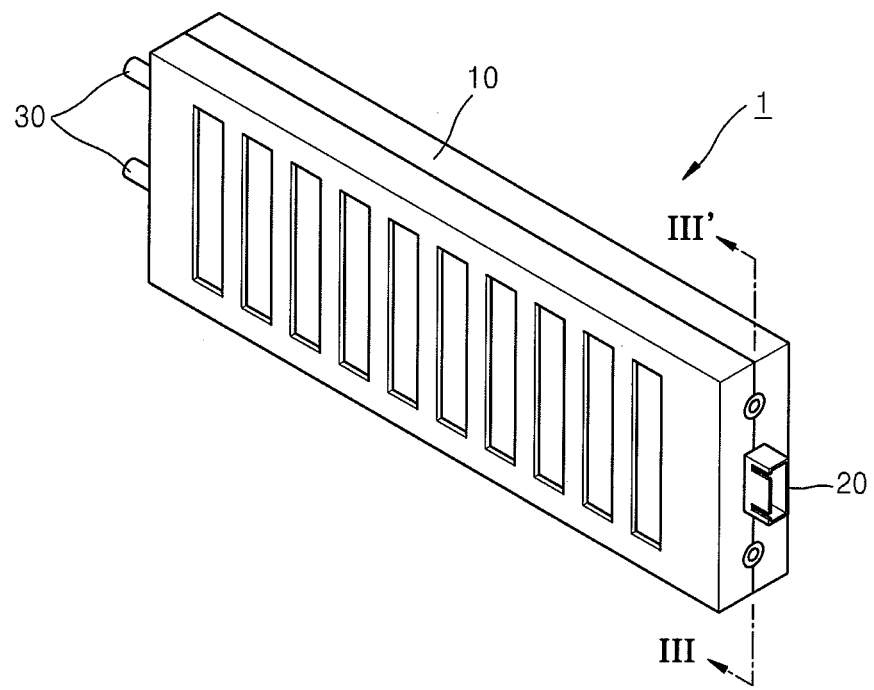
FIG. 1 is a perspective view of a unit uninterruptible power supply (UPS) module according to an embodiment of the present invention.

Reference will now be made in detail to certain embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

A unit uninterruptible power supply (UPS) module 1 or 2 will be described with reference to FIGS. 1 through 6, and a UPS 100 in which a plurality of unit UPS modules 1 and 2 are coupled to each other will be described with reference to FIGS. 7 and 8.

A first unit UPS module 1 will be described with reference to FIGS. 1 through 4E, and a second unit UPS module 2 will be described with reference to FIGS. 5 and 6.

Referring to FIGS. 1 through 4E, the first unit UPS module 1 according to an embodiment of the present invention includes a data communication terminal 20 protruding from the first unit UPS module 1 and disposed on an opposite side to charging/discharging terminals 30.

Figure 2:
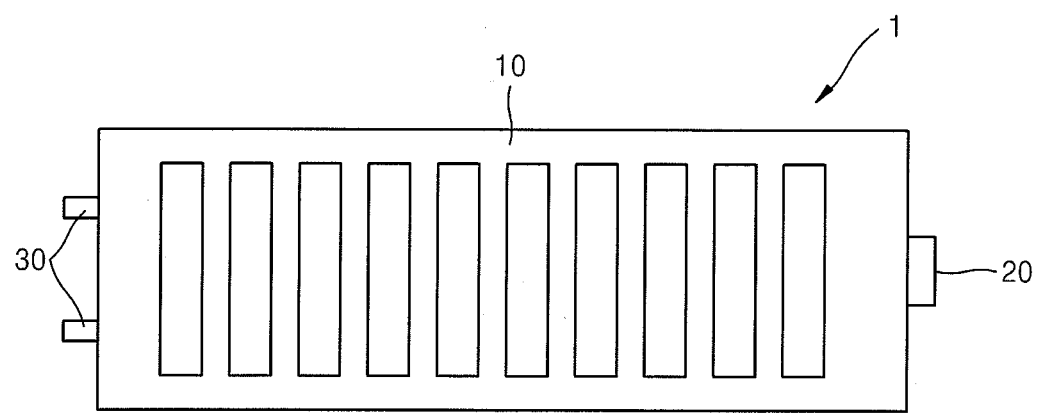
FIG. 2 is a side view of the unit UPS module shown in FIG. 1, according to an embodiment of the present invention.
Figure 3:
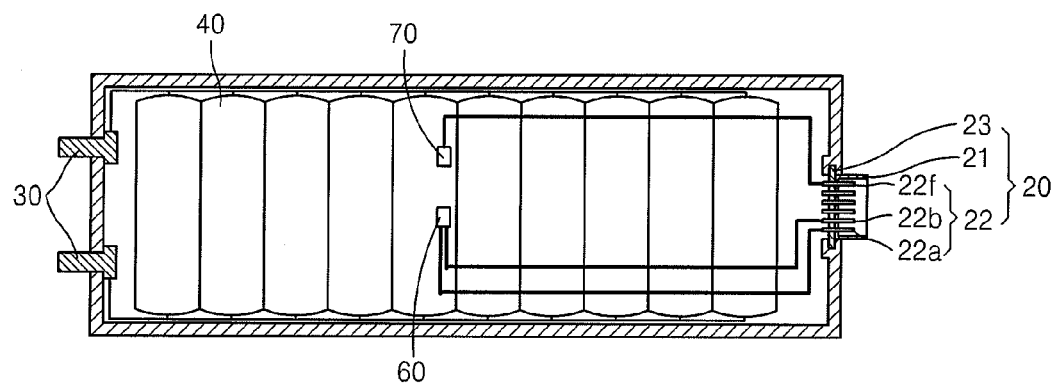
FIG. 3 is a cross-sectional view of the unit UPS module taken along a line III-III' of FIG. 1.
Figure 4A:
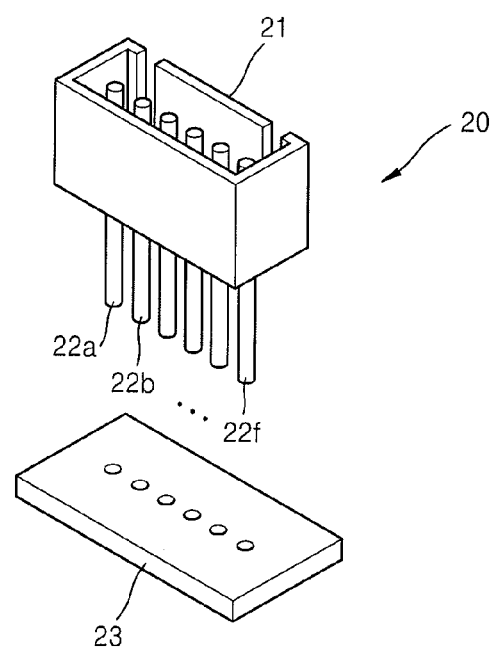
FIG. 4A is a schematic perspective view of a coupling structure between a connector and a printed circuit board (PCB), according to an embodiment of the present invention.
Figure 4B:
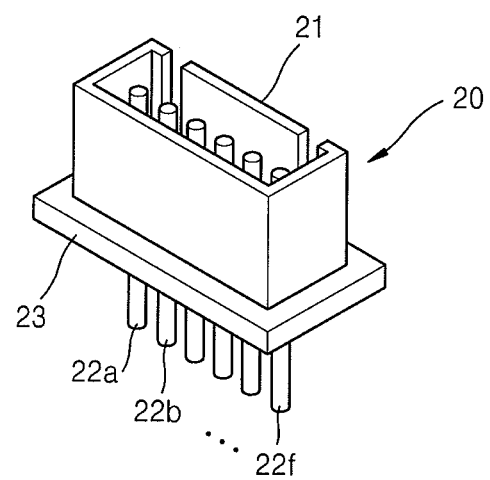
FIG. 4B is a schematic perspective view of a coupled state between the connector and the PCB shown in FIG. 4A.
Figure 4C:
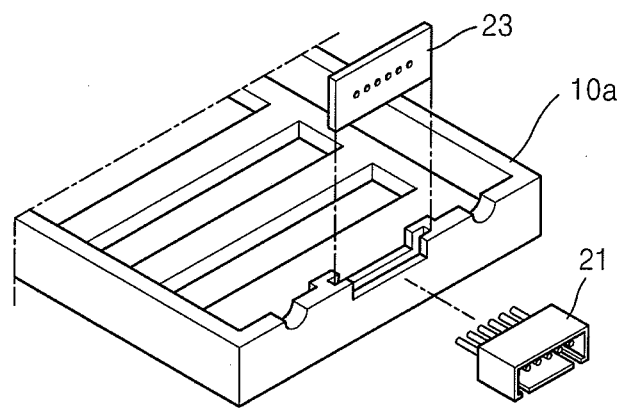
FIG. 4C is a schematic perspective view of a coupling relation between the connector, the PCB, and a lower plate of a unit UPS module case.
Figure 4D:
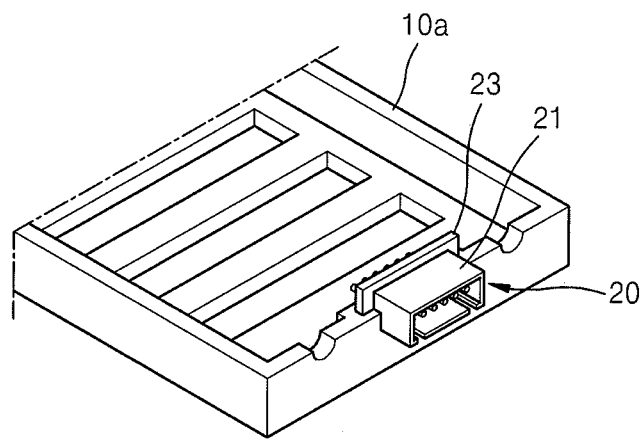
FIG. 4D is a schematic perspective view of a coupled state between the connector, the PCB, and the lower plate of the unit UPS module case of FIG. 4C.
Figure 4E:
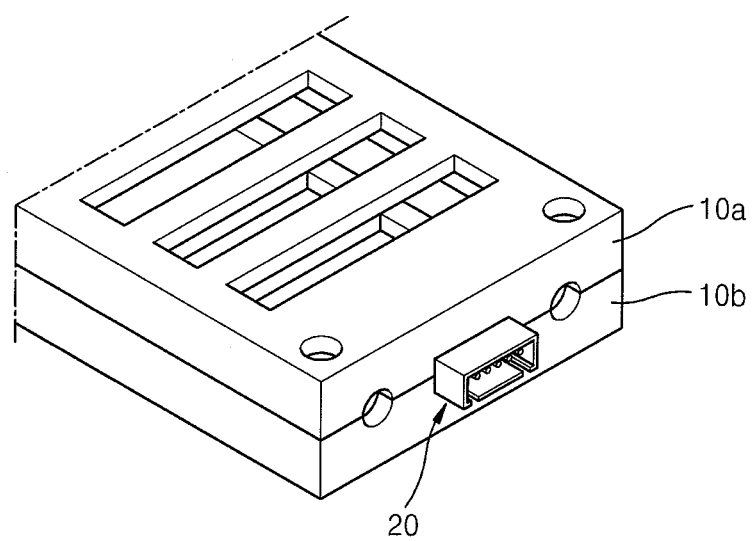
FIG. 4E is a schematic perspective view of the coupled structure shown in FIG. 4D, to which an upper plate of the unit UPS module case is attached.

FIG. 1 is a schematic perspective view of the first unit UPS module, from which the data communication terminal 20 protrudes, according to the present embodiment. FIG. 2 is a side view of the first unit UPS module 1. FIG. 3 is a cross-sectional view of the unit UPS module 1 taken along a line of FIG. 1. FIG. 4A is a schematic perspective view of a coupling structure between a connector 21 and a printed circuit board (PCB) 23, according to an embodiment of the present invention; FIG. 4B is a schematic perspective view of a coupled state between the connector 21 and the PCB 23 shown in FIG. 4A; FIG. 4C is a schematic perspective view of a coupling relation between the connector 21, the PCB 23, and a lower plate 10a of a unit UPS module case; FIG. 4D is a schematic perspective view of a coupled state between the connector 21, the PCB 34, and the lower plate 10a of the unit UPS module case of FIG. 4C; and FIG. 4E is a schematic perspective view of the coupled structure shown in FIG. 4D, to which an upper plate 10b of the unit UPS module case is attached.

Referring to FIGS. 1 through 3, the first unit UPS module 1 includes a first unit UPS module case 10, the data communication terminal 20, the charging/discharging terminals 30, and a battery 40.

In the illustrated embodiment, the data communication terminal 20 includes the connector 21, a connecting pin 22, and the PCB 23.

The connector 21 may include a plurality of connecting pins 22a, 22b, ..., 22f, to which a temperature sensor 60 and a balancing sensor 70 are electrically connected, respectively. Here, the number of connecting pins 22 is not limited to 6 as shown in FIG. 3, and one of ordinary skill in the art would appreciate that the number of connecting pins may vary.

The connector 21 may include a first terminal connected to the temperature sensor 60 and a second terminal connected to the balancing sensor 70. The first terminal may include a first connecting pin 22a and a second connecting pin 22b, and the second terminal may include a third connecting pin 22f. Here, the first terminal and the second terminal may be coupled to the connector 21 with a predetermined interval therebetween. Since the predetermined interval is maintained between the first terminal and the second terminal, electrical interference due to a voltage applied to the third connecting pin 22f that is connected to the balancing sensor 70 to the first and second connecting pins 22a and 22b may be reduced. For instance, the pin 22a corresponding to the first terminal and the pin 22f corresponding to the second terminal may be disposed so as to be farthest from each other in the connector 21.

The temperature sensor 60 can measure the temperature of the battery 40 while charging/discharging the battery 40 to check for overheating. When a plurality of batteries 40 is connected, the temperature sensor 60 may be attached to the battery 40 located on a center portion of the plurality of batteries 40. However, the location of the temperature sensor 60 is not limited to the above example. The temperature sensor 60 may be attached inside or outside of the battery 40.

The balancing sensor 70 can measure the amount of electrical charge in the battery 40. The balancing sensor 70 may receive a voltage of the battery 70 and send the data to a circuit device. The circuit device may detect an imbalance in the batteries 40, and in the case in which the detected voltage of the battery 40 indicates a predetermined imbalance condition, the circuit device may stop charging the imbalanced battery 40.

Referring to FIG. 3, the batteries 40 which are chargeable and dischargeable may be connected to each other in parallel or in series and electrically connected to an external device through the charging/discharging terminals 30.

Since electric current and voltage flowing in the charging/discharging terminals 30 are greater than those of the data communication terminal 20, interference may occur.

For example, when the amount of the electric current flowing in the charging/discharging terminal 30 is changed abnormally, then the data communication terminal 20 may malfunction.

Therefore, the charging/discharging terminals 30 and the data communication terminal 20 are located opposite each other in the first unit UPS module 1, and thus, the interference may be reduced.

Referring to FIG. 4A, the data communication terminal 20 includes the connector 21 and the PCB 23 coupled to each other. It can be difficult to couple the connector 21 to the unit UPS module case 10. However, as shown in FIG. 4B, since the connector 21 and the PCB 23 are coupled to each other according to an embodiment, the connector 21 may be coupled easily to the unit UPS module case 10. That is, as shown in FIG. 4C, the PCB 23 may be supported by the unit UPS module case 10, and the connector 21 may be inserted into the PCB 23 so that the connector 21 and the PCB 23 may be coupled to the lower plate 10a of the unit UPS module case 10 as shown in FIG. 4C. Here, the width of the PCB may be greater than the width of the connector. Then, the upper plate 10b of the unit UPS module case 10 may be placed on the lower plate 10a, and thus, as shown in FIG. 4E, the connector 21 and the PCB 23 may be coupled to the unit UPS module case 10.

According to an embodiment, the unit UPS module case 10 includes an indentation corresponding to the shape of the data communication terminal 20 so that the data communication terminal 20 and the unit UPS module case 10 may be coupled to each other without using an additional coupling unit. As described above, since the data communication terminal 20 is coupled to the indentation of the unit UPS module case 10, the coupling operation may be performed easily and the number of processes may be reduced.

In addition, a circuit device which is electrically connected to the temperature sensor 60 or the balancing sensor 70 may be connected to the PCB 23. Since the circuit device is disposed on the PCB 23, spatial efficiency may be improved.

The second unit UPS module 2 including the data communication terminal 20 that is depressed and disposed opposite to the charging/discharging terminals 30 will be described with reference to FIGS. 5 and 6.

Figure 5:
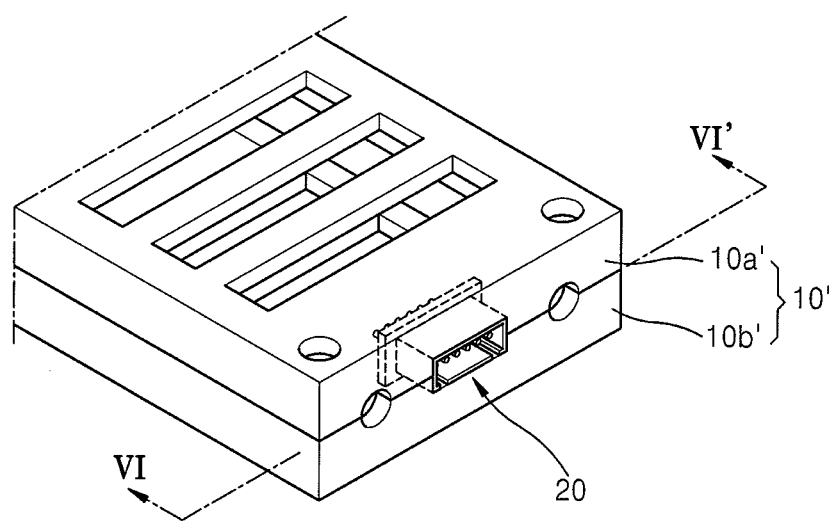
FIG. 5 is a schematic perspective view of a unit UPS module according to another embodiment of the present invention.
Figure 6:
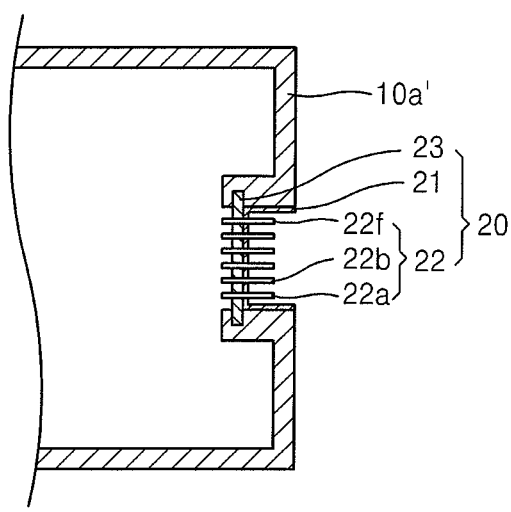
FIG. 6 is a cross-sectional view of the unit UPS module taken along a line VI-VI' of FIG. 5.

FIG. 5 is a schematic perspective view of the second unit UPS module 2, in which the data communication terminal 20 is depressed, according to another embodiment of the present invention. FIG. 6 is a cross-sectional view of the unit UPS module 2 taken along a line VI-VI' of FIG. 5.

The second unit UPS module 2 includes substantially the same components, that is, a second unit UPS module case 10', the data communication terminal 20, the charging/discharging terminals 30, and a battery 40. However, the second unit UPS module 2 is different from the first unit UPS module 1 in that the data communication terminal 20 does not protrude outside the second unit UPS module case 10'. The module case 10' is comprised of a lower plate 10a' and an upper plate 10b' in the same manner as described above in connection with FIG. 4A. Since the data communication terminal 20 does not protrude outside the second unit UPS module case 10', an external shock may not be transferred to the data communication terminal 20, and thus, a stable structure of the second unit UPS module 2 may be maintained. In addition, the data communication terminal 20 may be easily coupled to a first corresponding terminal 120 that will be described later with reference to FIG. 7.

A UPS 100 formed by coupling a plurality of unit UPS modules 1 or 2 to each other will be described with reference to FIGS. 7 and 8.

Figure 7:
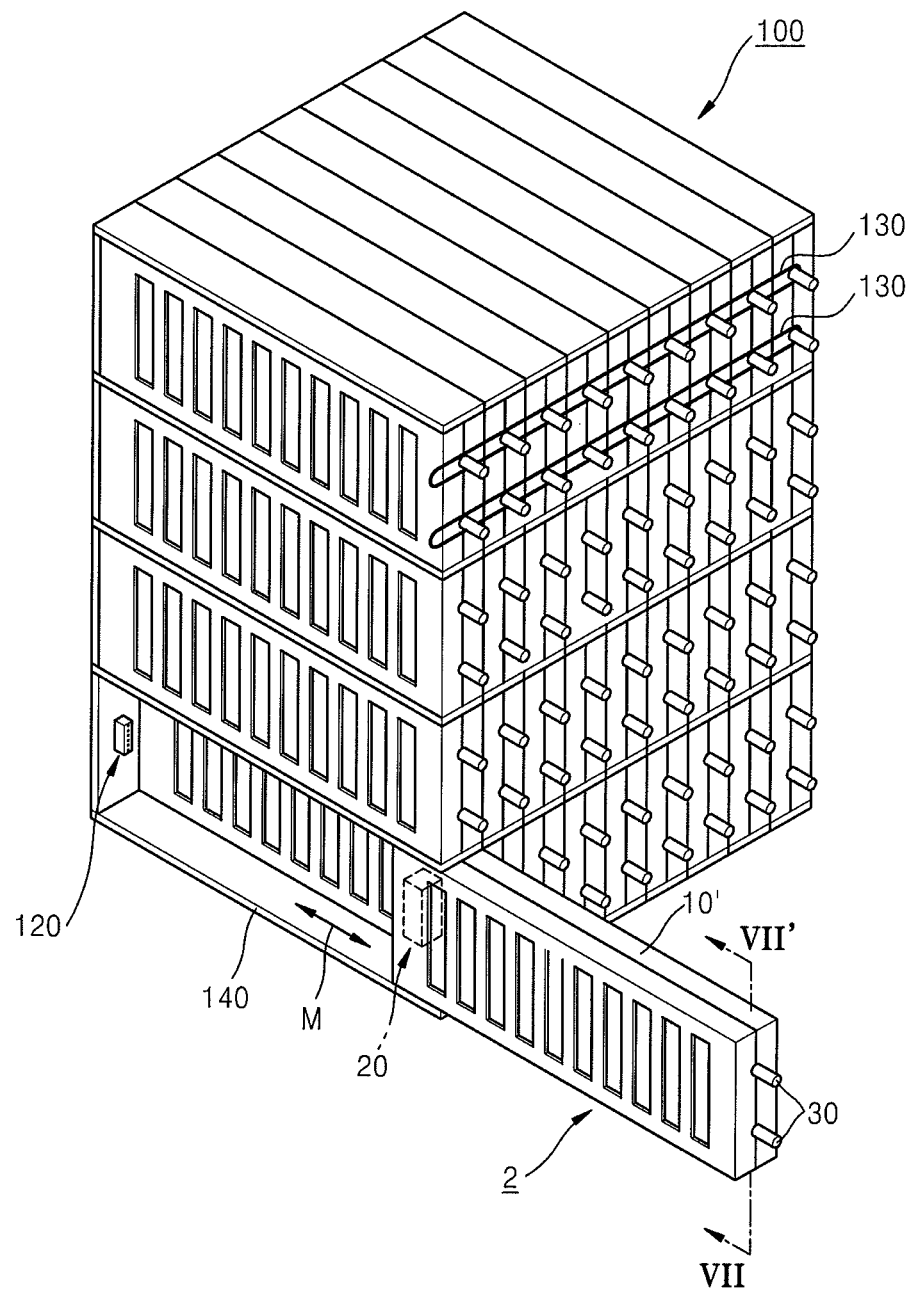
FIG. 7 is a schematic perspective view of a UPS having a case, in which a plurality of unit UPS modules are included, according to another embodiment of the present invention.
Figure 8:
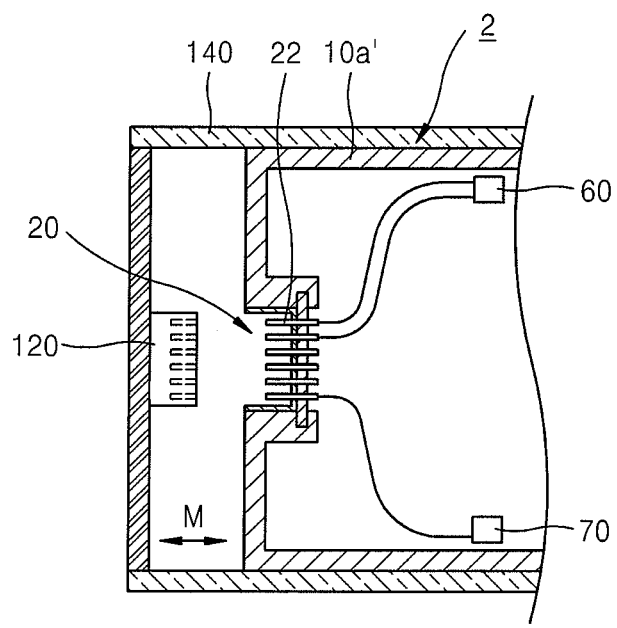
FIG. 8 is a cross-sectional view of the UPS taken along a line VII-VII' of FIG. 7.

FIG. 7 is a schematic perspective view of the UPS 100 including a plurality of unit UPS modules 1 or 2 in a case 110, according to another embodiment of the present invention. FIG. 8 is a cross-sectional view of the UPS 100 taken along a line VII-VII' of FIG. 7. Referring to FIGS. 7 and 8, the advantages of having the data communication terminal 20 and a charging/discharging terminal 30 on different sides of the unit UPS modules 2 will be described.

The UPS 100 includes the case 110, the first corresponding terminal 120, a bus bar 130, and a guide structure 140.

Referring to FIG. 7, the case 110 may include a plurality of second unit UPS modules 2, however, the present embodiment is not limited thereto, that is, the case 110 may include a plurality of first unit UPS modules 1. Here, the unit UPS module 1 or 2 may be slid along the guide structure 140 in a back-and-forth direction (M).

The first corresponding terminal 120 is disposed in the case 110 so as to transmit or receive electric signals to or from outside of the UPS 100. The first corresponding terminal 120 may be electrically coupled to the data communication terminal 20 of the unit UPS module 1 or 2 to transmit the electric signals. Here, the first corresponding terminal 120 and the data communication terminal 20 may be coupled to each other in a hermaphroditic coupling method. Here, the first corresponding terminal 120 may connect each of the electric signals to the outside.

The data communication terminal 20 that is coupled to the first corresponding terminal 120 may protrude from the module as in the first unit UPS module 1, or the data communication terminal 20 may be depressed in the module as in the second unit UPS module 2 to be coupled to the first corresponding terminal 120. As described above, when the data communication terminal 20 may be attached to or detached from the corresponding terminal 120 while the unit UPS module 1 or 2 is slid along the guide structure 140, it is not necessary to connect the first corresponding terminal 120 to the data communication terminal 20 one by one. Therefore, convenience in manufacturing the UPS 100 may be improved.

The first corresponding terminal 120 may be connected to an external controller so as to receive the temperature or electric status of the battery 40 from the unit UPS modules 1 or 2 as electric signals, and then, the temperature change or the electric status of the battery 40 may be measured in order to be analyzed or controlled.

The data communication terminal 20 and the charging/discharging terminal 30 in the unit UPS module 1 or 2 may be disposed on different portions of the module. The data communication terminal 20 disposed on a side of the unit UPS module 1 or 2 may be connected to the first corresponding terminal 120 in the case 110 of the UPS 100, and the charging/discharging terminal 30 disposed on the other side of the unit UPS module 1 or 2 may be connected to the bus bar 130 which electrically connects the charging/discharging terminal 30 to an external device. In this way, the coupling process between the first corresponding terminal 120 and the data communication terminal 20 may be improved, because rather than needing to connect each component one by one, it would be sufficient to slide the unit UPS modules 2 along the guide structure 140.

Whereas the data communication terminal 20 is disposed on one side of the unit UPS module 2 to improve the processability, the charging/discharging terminals 30 may be disposed on another side of the unit UPS module 2 so that a plurality of the charging/discharging terminals 30 may be simultaneously connected to the bus bar 130 in series or in parallel.

It should be understood that the embodiments described herein should be considered in a descriptive sense only and not for purposes of limitation. Descriptions of features or aspects within each embodiment should typically be considered as available for other similar features or aspects in other embodiments.

What is claimed is:

1. An uninterruptable power supply (UPS) module comprising: a battery: a case accommodating the battery: a data communication terminal disposed on a side of the case so as to transmit and receive electric signals representing data about a status of the battery to and from a first external device: and a terminal unit disposed on another side of the case to be electrically connected to a second external device, for charging or discharging the battery wherein the terminal unit is disposed on a side of the case that is the furthest side of the case from the side of the case on which the data communication terminal is disposed wherein both the terminal unit and the data communications terminal physically extend from an interior of the case to an exterior of the case.

2. The UPS module of claim 1, wherein the data communication terminal comprises at least a first terminal unit and a second terminal unit which respectively transmit and receive electric signals to and from a first sensor measuring a temperature of the battery and a second sensor measuring an electrical charge status of the battery.

3. The unit UPS module of claim 2, wherein the data communication terminal comprises:
   a connector comprising a plurality of protruding pins for electric connection; and
   a printed circuit board (PCB) comprising coupling recesses corresponding to the plurality of pins so that the plurality of pins are inserted into the coupling recesses to be coupled to the connector,
   wherein a width of the PCB is greater than a width of the connector.

4. The UPS module of claim 3, wherein a circuit device for at least one of the first sensor and the second sensor is coupled to the PCB.

5. The UPS module of claim 3, wherein the case comprises:
   an upper case; and
   a lower case,
   wherein the upper case and the lower case respectively comprise recesses corresponding to at least a part of the PCB and a part of the connector, the data communication terminal is inserted in the recess, and the upper case and the lower case are coupled to each other so that the data communication terminal is coupled to the case.

6. The UPS module of claim 1, wherein the data communication terminal is accommodated in the case so as not to protrude from the case.

7. The UPS module of claim 1, wherein the data communication terminal is coupled to the case so that a part of the data communication terminal protrudes from the case.

8. A UPS comprising: at least one UPS module comprising a battery, a case accommodating the battery, a data communication terminal disposed on a side of the case so as to transmit and receive electric signals representing data about a status of the battery to and from a first external device, and a terminal unit disposed on another side of the case to be electrically connected to a second external device, for charging and discharging the battery wherein the terminal unit is disposed on a side of the case that is the furthest side of the case from the side of the case on which the data communication terminal is disposed; and a first case accommodating the at least one UPS module and comprising at least one corresponding terminal that is electrically connected to the data communication terminal wherein both the terminal unit and the data communications terminal physically extend from an interior of the first case to an exterior of the first case.

9. The UPS of claim 8, wherein the data communication terminal comprises at least a first terminal unit and a second terminal unit which respectively transmit and receive electric signals to and from a first sensor measuring a temperature of the battery and a second sensor measuring an electrical charge status of the battery.

10. The UPS of claim 9, wherein the data communication terminal comprises:
    a connector including a plurality of protruding pins for electric connection; and
    a printed circuit board (PCB) including coupling recesses corresponding to the plurality of pins so that the plurality of pins are inserted into the coupling recesses to be coupled to the connector,
    wherein a width of the PCB is greater than a width of the connector.

11. The UPS of claim 10, wherein the pins corresponding to the first terminal unit and the pins corresponding to the second terminal unit are disposed so as to be the farthest from each other in the connector.

12. The UPS of claim 10, wherein a circuit device for at least one of the first sensor and the second sensor is coupled to the PCB.

13. The UPS of claim 10, wherein the case comprises:
    an upper case; and
    a lower case,
    wherein the upper case and the lower case respectively include recesses corresponding to at least a part of the PCB and a part of the connector, the data communication terminal is inserted in the recess, and the upper case and the lower case are coupled to each other so that the data communication terminal is coupled to the case.

14. The UPS of claim 8, further comprising a controller receiving electric signals from the first sensor and the second sensor in order to measure, analyze, and control change variation and electric status of the battery.

15. The UPS of claim 8, wherein the data communication terminal and the first corresponding terminal are coupled to each other in a hermaphroditic coupling method.

16. The UPS of claim 8, wherein the first case further comprises a guide structure so that the at least one UPS module is slid along the guide structure, and the data communication terminal of the at least one UPS module is coupled to the first corresponding terminal.

17. The UPS of claim 8, further comprising a bus bar for electrically connecting the terminal unit to the external device.

* * * * *